United States Patent
Gossmann et al.

(10) Patent No.: US 11,830,739 B2
(45) Date of Patent: Nov. 28, 2023

(54) TECHNIQUES TO INCREASE CMOS IMAGE SENSOR WELL DEPTH BY CYROGENIC ION CHANNELING OF ULTRA HIGH ENERGY IONS

(71) Applicant: Applied Materials, Inc., Santa Clara, CA (US)

(72) Inventors: Hans-Joachim L. Gossmann, Summit, NJ (US); Stanislav S. Todorov, Topsfield, MA (US); Hiroyuki Ito, Chiba (JP)

(73) Assignee: Applied Materials, Inc., Santa Clara, CA (US)

( * ) Notice: Subject to any disclaimer, the term of this patent is extended or adjusted under 35 U.S.C. 154(b) by 266 days.

(21) Appl. No.: 17/064,700

(22) Filed: Oct. 7, 2020

(65) Prior Publication Data
US 2022/0108893 A1    Apr. 7, 2022

(51) Int. Cl.
*H01L 21/265* (2006.01)
*H01L 27/146* (2006.01)

(52) U.S. Cl.
CPC .. *H01L 21/26593* (2013.01); *H01L 27/14601* (2013.01); *H01L 27/14643* (2013.01)

(58) Field of Classification Search
CPC ......... H01L 21/26586; H01L 21/26593; H01L 27/14689; H01L 27/14601; H01L 27/1461; H01L 27/14643; H01L 27/1463; H01L 21/76264; H01L 21/76224; H01L 21/76205
USPC ......................................................... 438/514
See application file for complete search history.

(56) References Cited

U.S. PATENT DOCUMENTS

| | | | |
|---|---|---|---|
| 7,935,942 B2 | 5/2011 | England et al. | |
| 2008/0044938 A1* | 2/2008 | England | H01L 21/67248 438/51 |
| 2008/0124830 A1* | 5/2008 | Lee | H01L 27/14683 438/59 |
| 2008/0145963 A1* | 6/2008 | Yang | H01L 27/14603 257/E21.135 |
| 2011/0143461 A1* | 6/2011 | Fish | H01L 21/67196 414/150 |

(Continued)

FOREIGN PATENT DOCUMENTS

| | | |
|---|---|---|
| CN | 104409354 A | 3/2015 |
| TW | I409941 B | 9/2013 |

OTHER PUBLICATIONS

International Search Report and Written Opinion dated Dec. 29, 2021, for the International Patent Application No. PCT/US2021/050602, filed on Sep. 16, 2021, 7 pages.

(Continued)

*Primary Examiner* — Didarul A Mazumder
(74) *Attorney, Agent, or Firm* — KDW Firm PLLC

(57) ABSTRACT

Provided herein are approaches for forming an image sensor with increased well depth due to cryogenic ion channeling of ultra-high energy (UHE) ions. In some embodiments, a method may include providing a wafer of a semiconductor device, the semiconductor device including a photoelectric conversion region, and cooling the wafer to a temperature less than −50° C. The method may further include performing an ion implant to the photoelectric conversion region to form a photodiode well after cooling the wafer.

18 Claims, 4 Drawing Sheets

(56) References Cited

U.S. PATENT DOCUMENTS

| | | | |
|---|---|---|---|
| 2013/0109190 A1* | 5/2013 | Lill | H01L 21/3065 |
| | | | 156/345.28 |
| 2014/0353468 A1* | 12/2014 | Choi | H01L 27/1464 |
| | | | 257/446 |
| 2015/0301454 A1* | 10/2015 | Kanome | H01L 21/26513 |
| | | | 438/60 |
| 2016/0365462 A1* | 12/2016 | Shoyama | H01L 31/03921 |
| 2018/0190619 A1* | 7/2018 | Sekar | H01L 23/481 |
| 2019/0115375 A1* | 4/2019 | Nah | H01L 27/1464 |
| 2020/0027697 A1* | 1/2020 | Kawasaki | H01L 27/14658 |
| 2020/0058684 A1* | 2/2020 | Wu | H01L 27/14607 |
| 2020/0111831 A1* | 4/2020 | Choi | H01L 27/14627 |
| 2020/0381464 A1* | 12/2020 | Hong | H01L 27/1463 |

OTHER PUBLICATIONS

W. Brandt, Channeling in Crystals Scientific American 218, 91 (1968), 9 pages.

* cited by examiner

TECHNIQUES TO INCREASE CMOS IMAGE SENSOR WELL DEPTH BY CYROGENIC ION CHANNELING OF ULTRA HIGH ENERGY IONS

FIELD OF THE DISCLOSURE

The present embodiments relate to approaches for forming semiconductor image sensors, and, in particular, to approaches for forming image sensors with increased well depth due to cryogenic ion channeling of ultra-high energy (UHE) ions.

BACKGROUND OF THE DISCLOSURE

An image sensor is a device that converts optical images into electrical signals. With increased development of the computer and communications industries, there is an increased demand for high performance image sensors in a variety of applications, e.g., digital cameras, camcorders, personal communication systems, gaming machines, security cameras, micro-cameras for medical applications, and more.

Image sensors generally fall into one of two main categories. The first is a charge coupled diode (CCD) and the second is a complementary metal-oxide semiconductor (CMOS) image sensor. CMOS image sensors are often configured to have signal processing circuits integrated on a single chip (e.g., silicon). In addition, CMOS image sensors may operate with relatively low consumption power, and thus, are applicable to products with low battery capacity (e.g., portable electronic devices). CMOS image sensors include a pixel typically consisting of a photodiode, an amplifier, a reset gate, a transfer gate, and floating diffusion.

To improve performance, CMOS image sensors need to capture infrared light, with wavelengths and efficiency increasing with every generation. This phenomenon demands that photodiode well depths become deeper, e.g., up to ~20 um. However, photodiode well depth is limited by the maximum energy of existing ion implanters and the degradation of channeling at high ion energies and heavy ion masses.

It is with respect to this and other challenges of existing image sensors that the present disclosure is provided.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In some embodiments, a method may include providing a wafer of a semiconductor device, the semiconductor device including a photoelectric conversion region, and cooling the wafer to a temperature less than −50° C. The method may further include performing an ion implant to the photoelectric conversion region to form a photodiode well after cooling the wafer.

In some embodiments, a complementary metal-oxide semiconductor image sensor (CIS) implant method may include exposing a photoelectric conversion region of a complementary metal-oxide semiconductor (CMOS) image sensor, and cooling the CMOS image sensor to a temperature less than −100° C. The method may further include performing a low-temperature ion implant to the photoelectric conversion region to form a photodiode well after cooling the CMOS image sensor.

In some embodiments, a method may include providing a set of photoelectric conversion regions of a complementary metal-oxide semiconductor device, cooling the CMOS device to a temperature less than −100° C., and performing, after cooling the CMOS device, a low-temperature ion implant to the set of photoelectric conversion regions to form a first photodiode well and a second photodiode well.

BRIEF DESCRIPTION OF THE DRAWINGS

The accompanying drawings illustrate exemplary approaches of the disclosure, including the practical application of the principles thereof, as follows.

Figure 1:
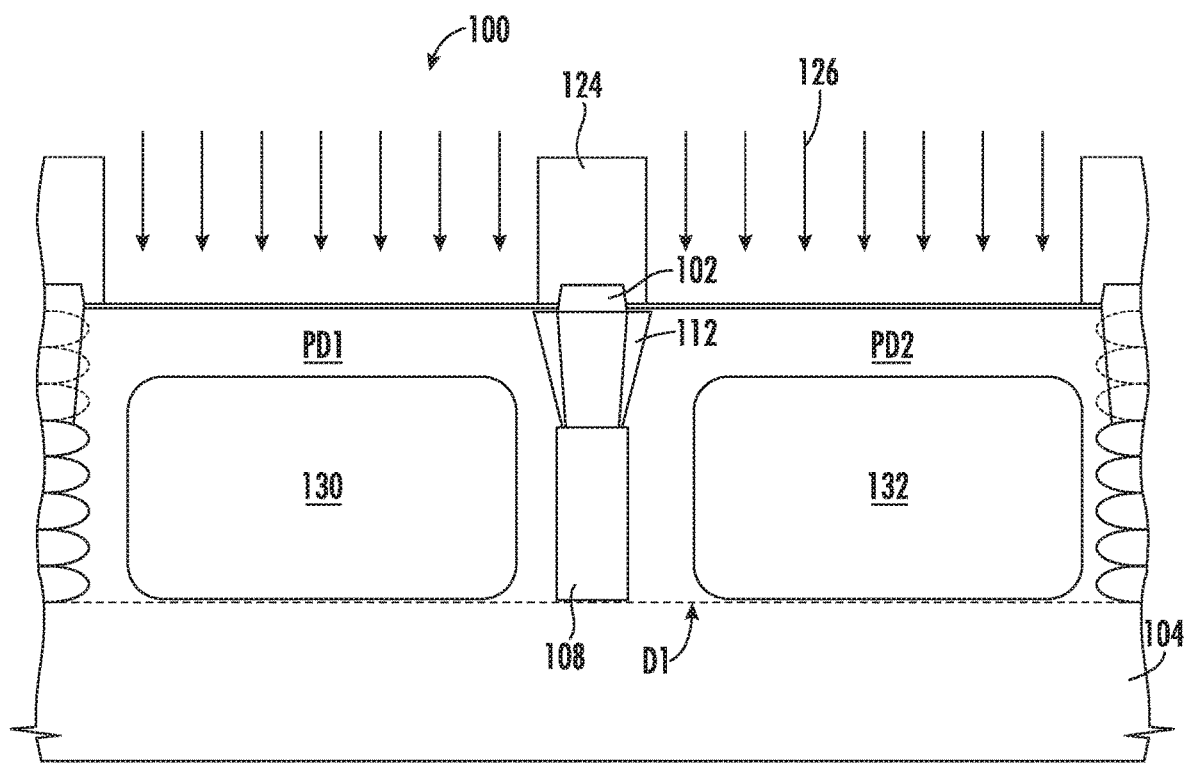
FIG. 1 illustrates a side cross-sectional view of a portion of an exemplary image sensor, according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Image sensors and methods in accordance with the present disclosure will now be described more fully hereinafter with reference to the accompanying drawings, where various embodiments are shown. The image sensors and methods may be embodied in many different forms and are not to be construed as being limited to the embodiments set forth herein. Instead, these embodiments are provided so the disclosure will be thorough and complete, and will fully convey the scope of the apparatuses, systems, and methods to those skilled in the art.

The present embodiments provide novel techniques to form devices, such as CMOS image sensors (CIS), having deeper photodiode wells formed by one or more ion implants performed at a low temperature, e.g., −100 degrees Celsius (C). The low-temperature implant improves ion channeling, which achieves deeper projection range of ions for a given energy. Advantageously, by making the photodiode wells deeper, sensitivity of the CIS is improved.

As described above, degradation of channeling occurs at high ion energies and heavy ion masses, e.g. Arsenic and others. The heavy ions interact with target crystals, causing the crystals to heat up. Increasing the temperature of the crystals, even if only locally, increases the vibrational amplitudes of the target's atoms, which decreases the amount of channeling of the projectiled atoms. Even a perfectly channeled ion has a higher probability for a close encounter with a target atom if the target atoms vibrate more with elevated temperatures. Said another way, the ions have a higher probability to protrude into the channel, which severely limits the achievable well depth.

Embodiments of the present disclosure overcome these limitations by reducing wafer temperature during implantation to −100° C., for example. In some embodiments, the low-temperature ion implant may be performed at cryogenic temperatures, i.e., at temperatures less than −150° C. Although non-limiting, it has been found that the low-temperature implant may advantageously gain approximately 2 μm in well depth.

Furthermore, the implant profile may also be more square-shaped, which advantageously provides a more uniform profile devoid of significant concentration peaks and valleys. More specifically, because photodiodes are formed using many (e.g., 9-15) separate doping implants, each at a different energy, each separate implant delivers dopant to a specific depth interval. This dopant "stacking" from the successive implants produces a continuous doping level from the bottom of the photodiode to the surface. If the individual profiles are squarish, with sharp drop offs in the concentration, it is much easier to obtain a uniform concentration. Conversely, individual profiles that are "peaky" will produce significant oscillations in the doping level once stacked, which in turn makes photoelectron generation depth dependent, resulting in a different response/efficiency of conversion of different light wavelengths.

FIG. 1 illustrates an image sensor (hereinafter "sensor") 100 at one stage of processing, according to embodiments of the present disclosure. It will be appreciated that the sensor 100 is shown for illustrative purposes only, and that the novel approaches herein may apply to various other image sensors (e.g., CCD and/or CMOS) in different embodiments. The sensor 100 may include a device isolation layer 102 disposed in a semiconductor epitaxial layer 104 in a boundary region between separate pixel regions. A first barrier region 108 may be disposed under the device isolation layer 102, the first barrier region 108 extending to a to a depth 'D1' of the semiconductor epitaxial layer 104. In some embodiments, a second barrier region 112 may be disposed in the semiconductor epitaxial layer 104, adjacent to a sidewall of the device isolation layer 102. The device isolation layer 102 and at least one of the first and second barrier regions 108, 112 provide a device isolation region between a first photoelectric conversion region 'PD1' and a second photoelectric conversion region 'PD2'.

As shown, during formation of the sensor 100, one or more ion implantation processes 126 may be performed to form a first photodiode well 130 in PD1 and a second photodiode well 132 in PD2. It will be appreciated that the first photodiode well 130 and PD1 correspond to a first photodiode and the second photodiode well 132 and PD2 correspond to a second photodiode. In some embodiments, a mask 124 is patterned to cover the first and second barrier regions 108, 112 and to expose PD1 and PD2. The mask 124 may be a photoresist pattern or an insulating pattern, for example. The first and second photodiode wells 130, 132 may be formed by injecting arsenic ions at a high implant energy, for example, 10 MeV. In other embodiments, different ions may alternatively or additionally be implanted. For example, a first implant process may inject arsenic ions into the semiconductor epitaxial layer 104, while a second implant process may inject phosphorous ions into the semiconductor epitaxial layer 104. Embodiments herein are not limited in this context. As will be described in greater detail below, the ion implantation process 126 may be performed after the sensor 100 is chilled, e.g., to a temperature between −150° C. and −100° C.

Although not shown, processing of the sensor may continue, e.g., by forming an interlayer insulating layer, an interconnection layer, and a passivation layer formed on the interlayer insulating layer. In some examples, a bottom portion of the semiconductor epitaxial layer 104 may be removed, and a color filter and the micro lens may then be formed on the bottom surface of the semiconductor epitaxial layer 104.

Figure 2:
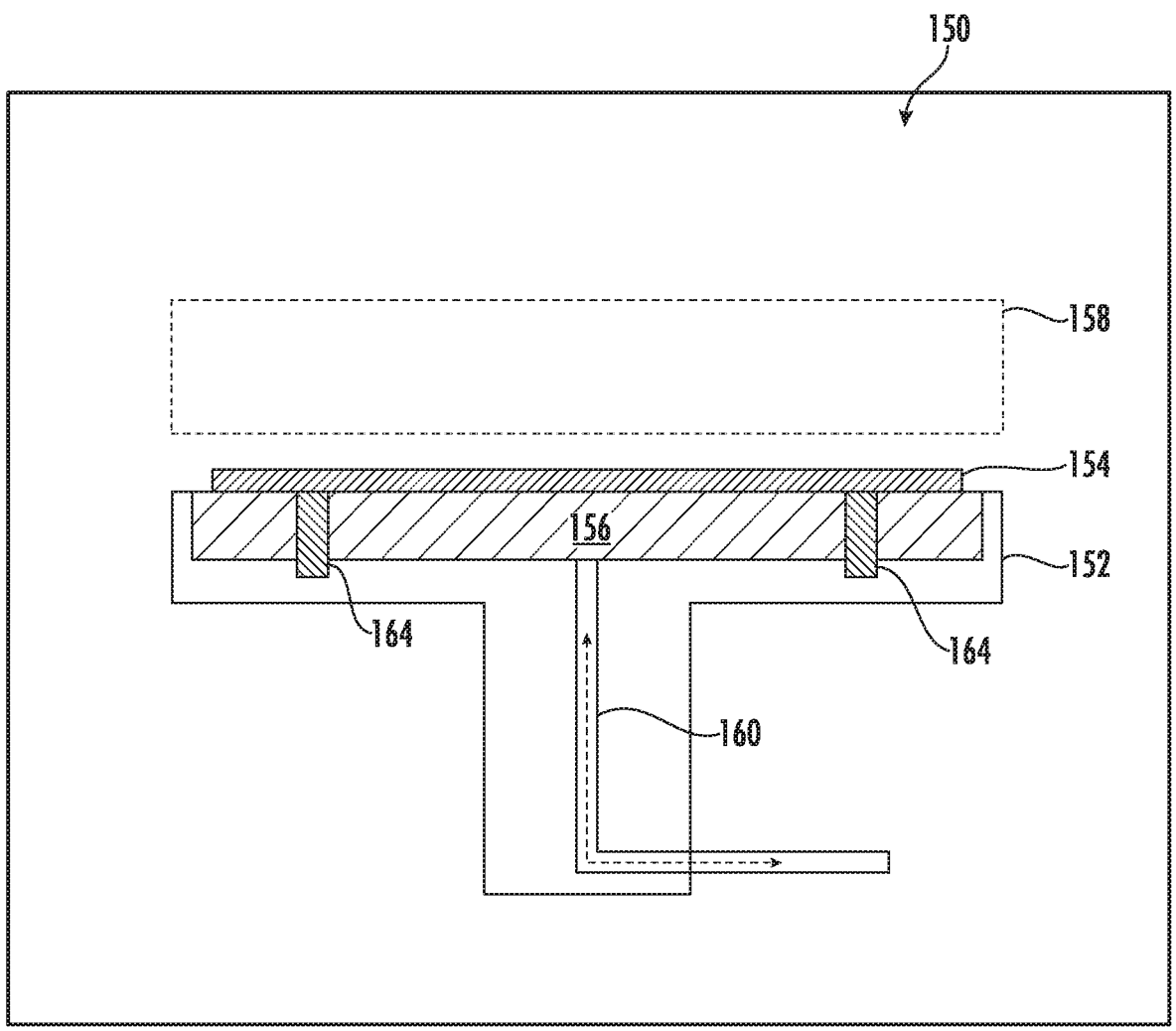
FIG. 2 illustrates a side cross-sectional view of an exemplary chilling station for low-temperature ion implantation, in accordance with embodiments of the present disclosure.

FIG. 2 shows a side cross-sectional view of an exemplary chilling station 150 for low-temperature ion implantation in accordance with embodiments of the present disclosure. The chilling station 150 may include a wafer holder 152 that can hold and cool a wafer 154 placed thereon. The sensor 100 (FIG. 1) may be part of, or positioned atop, the wafer 154. The wafer holder 152 may be a simple fixed platen as there is typically no need to tilt or rotate the wafer during its pre-chilling process. Embodiments herein are not limited in this context, however. According to one embodiment, the wafer 154 may be coupled to the wafer holder 152 with a backside gas (e.g., nitrogen).

In various embodiments, the chilling station 150 may include a cooling mechanism that employs any of a number of cooling techniques to bring the wafer 154 to a desired temperature range. For example, a backside cooling assembly 156 may cool the backside of the wafer 154, and/or a front-side cooling assembly 158 may cool the front side of the wafer 154. The backside cooling assembly 156 may provide a heat sink (not specifically shown) in direct contact with the wafer 154 and may circulate coolant (e.g., water or a cryogenic fluid, e.g., nitrogen, methane, argon, helium, hydrogen, nitrogen, oxygen, etc.), which is received through a pipeline 160. The backside cooling assembly 156 may also take advantage of the phase change of a coolant (e.g., ammonia $NH_3$) to cool the wafer 154 consistently to approximately the same temperature. The backside cooling assembly 156 may also comprise a built-in cryopump (not specifically shown) that directly transfers heat from the backside of the wafer 154. Alternatively, the backside cooling assembly 156 may include an array of (stacked) Peltier devices (not specifically shown) for thermoelectric cooling. The front-side cooling assembly 158 may likewise implement any of a wide variety of cooling techniques to achieve a fast and accurate cooling of the wafer 154.

In addition to cooling capabilities, the wafer holder 152 may also accommodate automatic wafer handling. For example, there may be provided a set of lift pins 164 to keep the wafer 154 in a wafer transfer plane during loading and unloading by robotic arms.

The chilling station 150 may be part of a low-temperature ion implanter (not shown). In some embodiments, the system may be based on an end station in an existing ion implanter. The end station may comprise a process chamber and one or more loadlocks. Inside the process chamber may be a wafer platen, the chilling station 150, and transfer robots. The chilling station 150 may serve the purpose of pre-chilling the wafer 154 to a desired temperature range prior to ion implantation, such as the ion implantation process 126 to form the first and second photodiode wells 130, 132, as described above.

According to alternative embodiments of the present disclosure, the chilling process may take place not on a pre-chiller as described above, but in one of the loadlocks. For example, a loadlock may be modified to include or be coupled to a cooling mechanism, such that one or more wafers loaded into the loadlock may be cooled therein before being loaded into the process chamber for ion implantation. In other words, a loadlock may be converted or used as a pre-chill station. In the case of a pre-chiller/loadlock combination, it may also be desirable to include heating capabilities therein in order to warm up a wafer after a low-temperature ion implantation process. Furthermore, according to an alternative embodiment of the present disclosure, some or all of the pre-chilling and/or post-heating capabilities may be provided with a modified end-effector (or other component) of a transfer robot. In addition, one or more thermal sensors and other control electronics may be provided in association with the cooling/heating mechanism in the transfer robot. It will be appreciated that alternative approaches for chilling the sensor 100 for the purposes of performing a low-temperature ion implant are possible within the scope of the present disclosure.

Figure 3A:
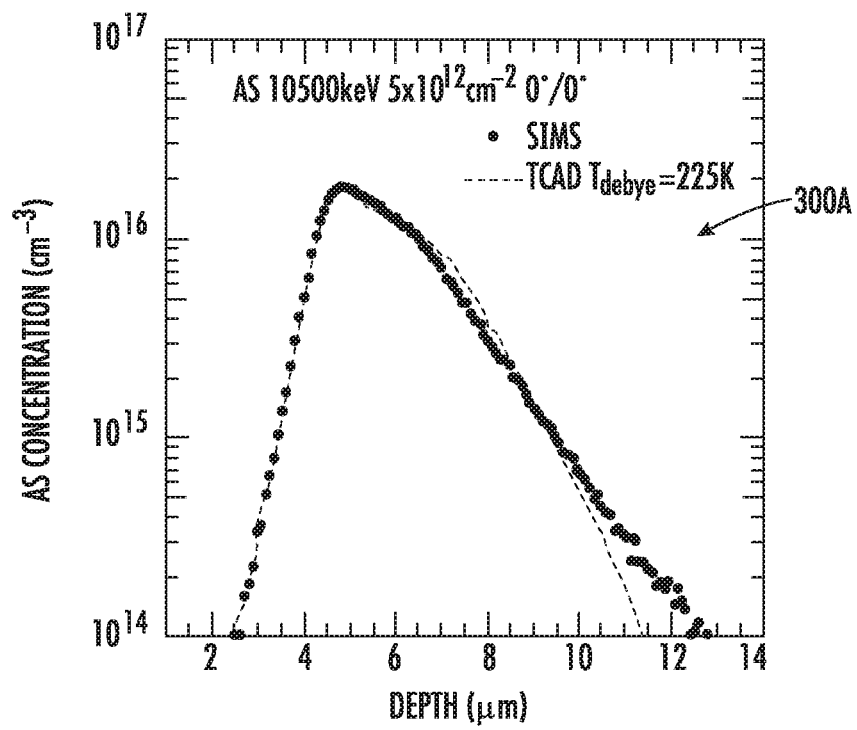
FIGS. 3A-3B are graphs illustrating arsenic (As) concentration versus photodiode well depth at different temperatures, in accordance with embodiments of the present disclosure.
Figure 3B:
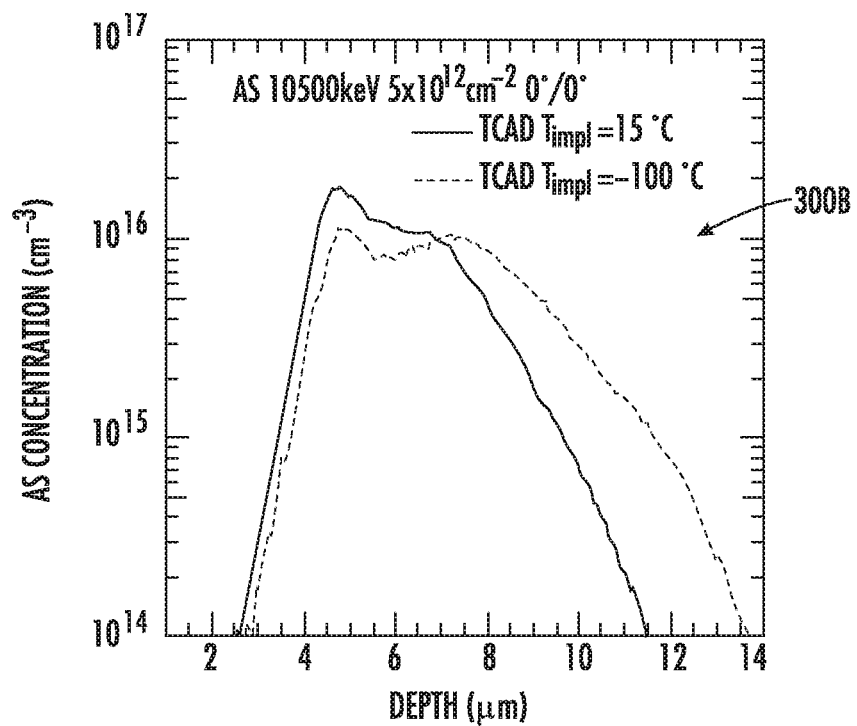

FIGS. 3A-3B illustrate various graphs of arsenic (As) concentration versus photodiode well depth for different temperatures. For example, graph 300A in FIG. 3A demonstrates SIMS data and Technology Computer Aided Design (TCAD) results for an arsenic implant performed at 225° K and at an implant energy of 10,500 keV. As shown, the TCAD implant depth is less than 11.5 µm. Graph 300B in FIG. 3B shows TCAD results for an arsenic implant performed at the same implant energy of 10,500 keV, but at different temperatures, i.e., at 15° C. and −100° C. In this case, the implant depth performed at −100° C. increases to approximately 14 µm. Meanwhile, the implant depth performed at 15° C. remains at approximately 11.5 µm.

Figure 4:
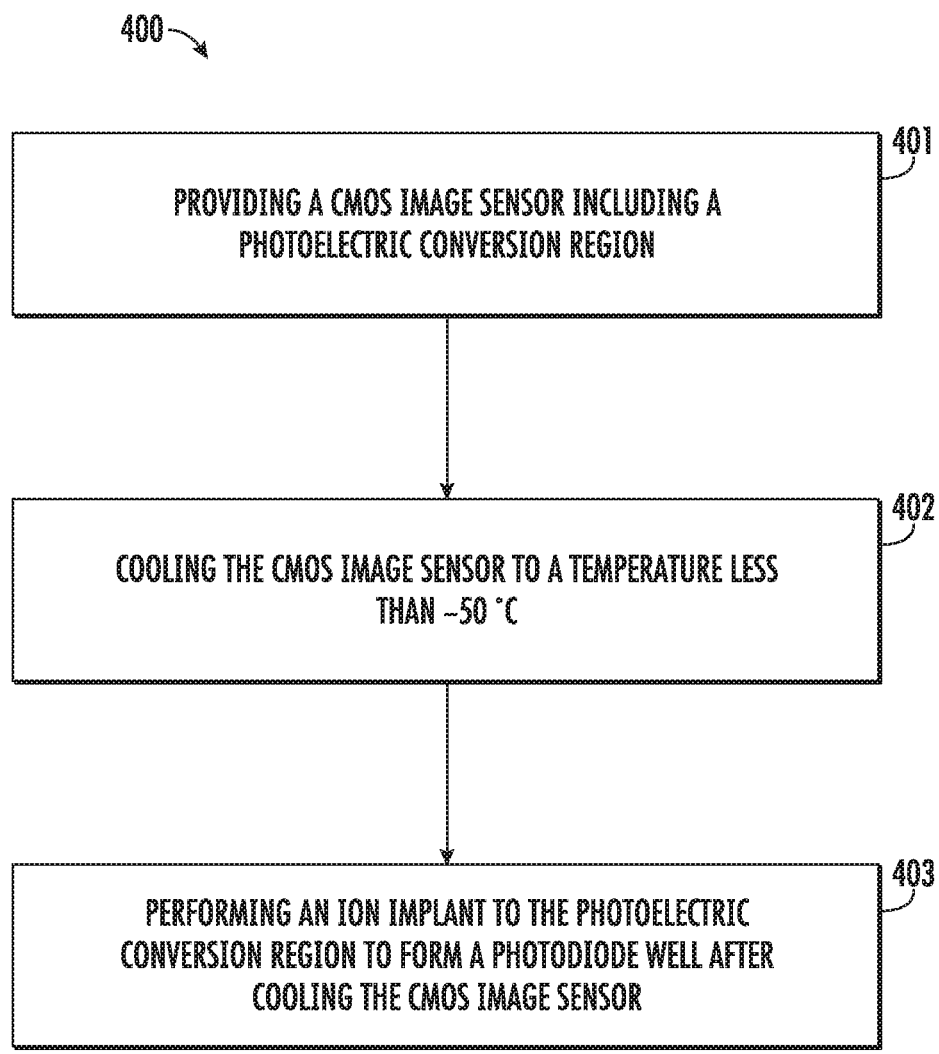
FIG. 4 shows a process flow according to embodiments of the disclosure.

Turning now to FIG. 4, a method 400 according to embodiments of the present disclosure will be described. At block 401, the method 400 may include providing a CMOS image sensor including a photoelectric conversion region. At block 402, the method 400 may include cooling the CMOS image sensor to a temperature less than −50° C. In some embodiments, the CMOS image sensor is cooled to a temperature less than −100° C. In some embodiments, the CMOS image sensor is cooled to a cryogenic temperature (e.g., −150° C.) using a cryogenic fluid, such as nitrogen, methane, argon, helium, hydrogen, nitrogen, oxygen, etc. In some embodiments, the CMOS image sensor is cooled within a chilling station.

At block 403, the method 400 may further include performing an ion implant to the photoelectric conversion region to form a photodiode well after cooling the CMOS image sensor. In some embodiments, the ion implant includes injecting arsenic ions into the photoelectric conversion region. In some embodiments, the arsenic ions are delivered at an ultra-high energy (UHE), such as at 10 MeV or greater. In some embodiments, the photodiode well may be formed a semiconductor epitaxial layer. In some embodiments, a first barrier region and a second barrier region are formed in the semiconductor epitaxial layer. In some embodiments, a mask is formed over the first barrier region and the second barrier region, wherein an opening in the mask exposes the photoelectric conversion region for treatment by the implantation process.

In various embodiments, design tools can be provided and configured to create the datasets used to produce the void-free trench-fills described herein. For example, data sets can be created to directionally etch a seed layer from predetermined portion of a trench and/or fin as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the description, the various features and functionality described herein may be implemented in any given application. Furthermore, the various features and functionality can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method for forming an image sensor, comprising:
providing a wafer of a semiconductor device, the semiconductor device including a photoelectric conversion region;
forming a first barrier region in a semiconductor epitaxial layer of the semiconductor device;
providing a device isolation layer over the first barrier region;
providing a mask over the first barrier region and over the device isolation layer, wherein an opening in the mask exposes the photoelectric conversion region;
cooling the wafer to a temperature less than −50° C.; and
performing an ion implant to the photoelectric conversion region to form a photodiode well after cooling the wafer, wherein the ion implant is performed through the opening in the mask while the mask is present over the first barrier region and over the device isolation layer.

2. The method of claim 1, further comprising cooling the wafer to a temperature less than −80° C.

3. The method of claim 1, further comprising cooling the wafer to a temperature less than −100° C.

4. The method of claim 1, wherein performing the ion implant comprises injecting arsenic ions into the photoelectric conversion region.

5. The method of claim 4, wherein the arsenic ions are delivered at an implant energy greater than 10 MeV.

6. The method of claim 1, further comprising forming the photodiode well in the semiconductor epitaxial layer.

7. The method of claim 6, further comprising forming a second barrier region in the semiconductor epitaxial layer.

8. The method of claim 7, further comprising providing the mask over the second barrier region.

9. The method of claim 1, further comprising cooling the wafer within a chilling station.

10. A complementary metal-oxide semiconductor image sensor (CIS) implant method, comprising:
exposing a photoelectric conversion region of a complementary metal-oxide semiconductor (CMOS) device;
forming a first barrier region in a semiconductor epitaxial layer of the CMOS device;
providing a device isolation layer over the first barrier region;
providing a mask over the first barrier region and over the device isolation layer, wherein an opening in the mask exposes the photoelectric conversion region;
cooling the CMOS device to a temperature less than −100° C.; and
performing a low-temperature ion implant to the photoelectric conversion region to form a photodiode well after cooling the CMOS device, wherein the low-temperature ion implant is performed through the opening in the mask while the mask is present over the first barrier region and over the device isolation layer.

11. The CIS implant method of claim 10, wherein performing the low-temperature ion implant comprises injecting arsenic ions into the photoelectric conversion region.

12. The CIS implant method of claim 11, wherein the arsenic ions are delivered at an implant energy greater than 10 MeV.

13. The CIS implant method of claim 10, further comprising:
forming the photodiode well in the semiconductor epitaxial layer; and
forming a second barrier region in the semiconductor epitaxial layer.

14. The method of claim 10, further comprising cooling the CMOS device within a chilling station, wherein the chilling station includes at least one of a backside cooling assembly and a front-side cooling assembly operable to lower a temperature of the CMOS device.

15. A method, comprising:
providing a set of photoelectric conversion regions of a complementary metal-oxide semiconductor (CMOS) device;
forming a first barrier region in a semiconductor epitaxial layer of the CMOS device;
providing a device isolation layer over the first barrier region;
providing a mask over the first barrier region and over the device isolation layer, wherein openings in the mask expose each of the set of photoelectric conversion regions;
cooling the CMOS device to a temperature less than −100° C.; and
performing, after cooling the CMOS device, a low-temperature ion implant to the set of photoelectric conversion regions to form a first photodiode well and a second photodiode well, wherein the low-temperature ion implant is performed through the openings in the mask while the mask is present over the first barrier region and over the device isolation layer.

16. The method of claim 15, wherein performing the low-temperature ion implant comprises injecting arsenic ions into the set of photoelectric conversion regions, and wherein the arsenic ions are delivered at an implant energy greater than 10 MeV.

17. The method of claim 15, further comprising:
forming the first and second photodiode wells in the semiconductor epitaxial layer; and
forming a second barrier region in the semiconductor epitaxial layer.

18. The method of claim 15, further comprising cooling the CMOS device using a cryogenic fluid delivered to a wafer holder, the wafer holder in direct contact with the CMOS device.

* * * * *